United States Patent [19]
Gruetzner et al.

[11] Patent Number: 5,297,151
[45] Date of Patent: Mar. 22, 1994

[54] ADJUSTABLE WEIGHTED RANDOM TEST PATTERN GENERATOR FOR LOGIC CIRCUITS

[75] Inventors: Matthias Gruetzner, Stuttgart, Fed. Rep. of Germany; Leendert M. Huisman, Peekskill; Sandip Kundu, Mohegan Lake, both of N.Y.; Cordt W. Starke, Weil Der Stadt, Fed. Rep. of Germany

[73] Assignee: International Business Machines Corporation, Armonk, N.Y.

[21] Appl. No.: 900,706

[22] Filed: Jun. 17, 1992

[51] Int. Cl.$^5$ .............................................. G01R 31/28
[52] U.S. Cl. ...................................... 371/27; 371/22.1
[58] Field of Search ............... 371/27, 16.1, 22.1, 371/22.2, 22.3, 22.5, 23.6, 25.1; 364/717

[56] References Cited

U.S. PATENT DOCUMENTS

| | | | |
|---|---|---|---|
| 4,817,093 | 3/1989 | Jacobs et al. | 371/22.3 |
| 5,043,988 | 8/1991 | Brglez et al. | 371/22.3 |

FOREIGN PATENT DOCUMENTS

| | | |
|---|---|---|
| 3639577 | 5/1988 | Fed. Rep. of Germany . |
| 9103014 | 3/1991 | PCT Int'l Appl. . |

OTHER PUBLICATIONS

J. A. Waicukauski et al. "A method for generating weighted random test patterns." IBM Journal of Research and Development. vol. 33, pp. 149–161, Mar. 1989.

B. Koenemann. "Application of STAGE for Biased Random Pattern Testing." May 1991.

S. F. Dennis et al. "Test Generation Using an Efficient Weight Generator." IBM Technical Disclosure Bulletin. Vol. 32, pp. 429–433, Sep. 1989.

B. Koenemann. "Biased Random Pattern Test Generation." IBM Technical Disclosure Bulletin. vol. 33, pp. 411–412, Jul. 1990.

F. Muradali et al. "A New Procedure For Weighted Random Built-In Self-Test." IEEE Proceedings International Test Conference. Pp. 660–669, Sep. 1990.

*Primary Examiner*—Vincent P. Canney
*Attorney, Agent, or Firm*—Marc D. Schechter

[57] ABSTRACT

A test pattern generator includes a random pattern generator and a shift register. The random pattern generator generates a series of digits which are input to the shift register and stored therein. Each digit output by the random pattern generator has a probability of having a first value, such as representing "1". The output probability of the random pattern generator is adjustable. The shift register has a plurality of outputs for outputting a test pattern comprising the stored digits. The shift register includes a series of latches and at least a first logic circuit connecting the output of the random pattern generator to the input of a first latch, or connecting the output of a latch to the input of a next adjacent latch. In a first state, the logic circuit has an output probability which is independent of the output probability of the random pattern generator. In a second state, the logic circuit has an output probability which is dependent on the output probability of the random pattern generator.

16 Claims, 6 Drawing Sheets

ADJUSTABLE WEIGHTED RANDOM TEST PATTERN GENERATOR FOR LOGIC CIRCUITS

BACKGROUND OF THE INVENTION

The invention relates to test pattern generators for logic circuits.

Logic circuits for data processing and other apparatus typically consist of a network of interconnected logic gates, such as "AND" gates, "OR" gates, "NAND" gates, "NOR" gates, "NOT" gates, "XOR" gates, and so on. The network of gates has a number of inputs for receiving digits, and has a number of outputs for outputting digits. The logic circuit is designed such that for each input digit pattern, of a set of one or more input digit patterns, provided at the inputs of the network, a corresponding predetermined output digit pattern is produced at the outputs of the network.

If there is a fault or defect in the logic circuit, then for one or more input digit patterns provided at the inputs of the network, the observed output digit patterns produced at the outputs of the network will differ from the expected predetermined output digit patterns.

One way to test for faults in a logic circuit is to apply each possible input digit pattern at the inputs of the logic network, and to compare the actual output digit pattern with the expected output digit pattern. For small numbers of possible input digit patterns, the cost of storing the expected output digit patterns and performing this deterministic testing is reasonable. However, for large numbers of possible input digit patterns, the cost of such deterministic testing is too high.

An alternative method of testing for faults in a logic circuit is to apply random input digit test patterns at the inputs of the logic network, and to compare the actual output digit patterns with the expected output digit patterns. The number of random test patterns needed to achieve a selected level of confidence that a logic circuit contains no faults depends on the set of input digit patterns for which the logic circuit is designed.

Therefore, another alternative method of testing for faults in a logic circuit is to apply one or more weighted random input digit test patterns at the inputs of a logic network, and to compare the actual output digit patterns with the expected output digit patterns. In a weighted random input digit test pattern, there is at least one digit for which the probability of occurrence of one value is different from 1/N, where N is the number of different possible values of the digit. For example, for a binary digit having one of N=2 values (either "1" or "0"), in a weighted random input digit test pattern the probability of occurrence of "1" is $P(1) = W(\frac{1}{2})$, and the probability of occurrence of "0" is $P(0) = 1 - W(\frac{1}{2})$, where the weight W is any positive number other than one.

The weights W may be uniform across all digits in the test pattern, or the weights may be nonuniform. The weighted random test patterns are selected to achieve, efficiently and at low cost, a desired level of confidence that the logic circuit contains no faults. Weighted random testing can significantly decrease the number of test patterns which must be applied to a logic circuit to obtain the same test effectiveness as an unweighted random test.

SUMMARY OF THE INVENTION

It is an object of the invention to provide a test pattern generator for selectively generating multiple different weighted random test patterns, and particularly multiple different nonuniform weighted random test patterns.

It is another object of the invention to provide a test pattern generator for selectively generating multiple different weighted random test patterns, which test pattern generator can be provided within a small area of an electronic chip containing a logic circuit to be tested.

It is a further object of the invention to provide a test pattern generator for selectively generating multiple different weighted random test, which test pattern generator does not interfere with or impact the performance of the logic circuit to be tested.

According to the invention, an apparatus for generating test patterns comprises a random pattern generator for generating a series of digit signals at an output of the random pattern generator. Each digit signal in the series has an initial probability of having a first value. The initial probability is adjustable.

A shift register is provided for storing a plurality of digit signals of a test pattern. The shift register has an input for receiving digit signals from the output of the random pattern generator. The shift register has a plurality of outputs for outputting a test pattern comprising the stored digit signals.

In the apparatus according to the present invention, the shift register comprises a series of latches and at least a first logic circuit. Each latch in the series of latches has an input and has an output. The input of a first latch is connected to the output of the random pattern generator. The output of each latch is connected to the input of a next adjacent latch. Each latch stores one digit signal of a test pattern.

The first logic circuit connects the output of the random pattern generator to the input of the first latch or connects the output of a latch to the input of a next adjacent latch. The logic circuit has first and second states, and a control input for selecting either the first state or the second state. The logic circuit has a data output for outputting a series of digit signals. Each digit signal output by the logic circuit has a first output probability of having the first value when the logic circuit is in the first state. The first output probability is independent of the initial probability produced by the random pattern generator. Each digit signal output by the logic circuit has a second output probability of having the first value when the logic circuit is in the second state. The second output probability is dependent upon the initial probability produced by the random pattern generator.

The latch may be, for example, a binary electronic latch in which each digit signal has one of only first and second values.

The first value of the digit signal may, for example, represent one. The second value of the digit signal may, for example, represent zero. Each digit signal generated by the random pattern generator may, for example, have a probability $P_1$ of representing one, and a probability $P_0 = 1 - P_1$ of representing zero.

Similarly, each digit signal output by the logic circuit has a probability $R_1$ of representing one, and has a probability $R_0 = 1 - R_1$ of representing zero when the logic circuit is in the first state. Each digit signal output by the logic circuit has a probability $Q_1$ representing one, and has a probability $Q_0 = 1 - Q_1$ of representing zero when the logic circuit is in the second state.

The logic circuit may comprise, for example, a logical OR gate having a first input connected to the output of the random pattern generator or to the output of a latch. The logical OR gate has a second input connected to a control line.

Alternatively, the logic circuit may comprise a logical AND gate having a first input connected to the output of the random pattern generator, or to the output of a latch. The logical AND gate has a second input connected to a control line.

In the test generator, each latch has an input for receiving digit signals from the output of the logic circuit or from the output of a prior adjacent latch. Each latch has an output for outputting digit signals to a circuit to be tested.

The apparatus for generating test patterns may further comprise a second logic circuit for connecting the output of a latch to the input of a next adjacent latch. The first logic circuit is arranged in the shift register between the random pattern generator and the second logic circuit.

By providing a test pattern generator having at least one logic circuit having a first state in which the output probability of the logic circuit is independent of the output probability of the random pattern generator, and having a second state in which the output probability of the logic circuit is dependent on the output probability of the random pattern generator, it is possible to generate two or more different uniform or nonuniform weighted random test patterns. At the same time, the test pattern generator can be provided within a small area of an electronic chip containing the logic circuit to be tested, and the generator will not interfere with the operation of the logic circuit to be tested.

DESCRIPTION OF THE PREFERRED EMBODIMENTS

Figure 1:
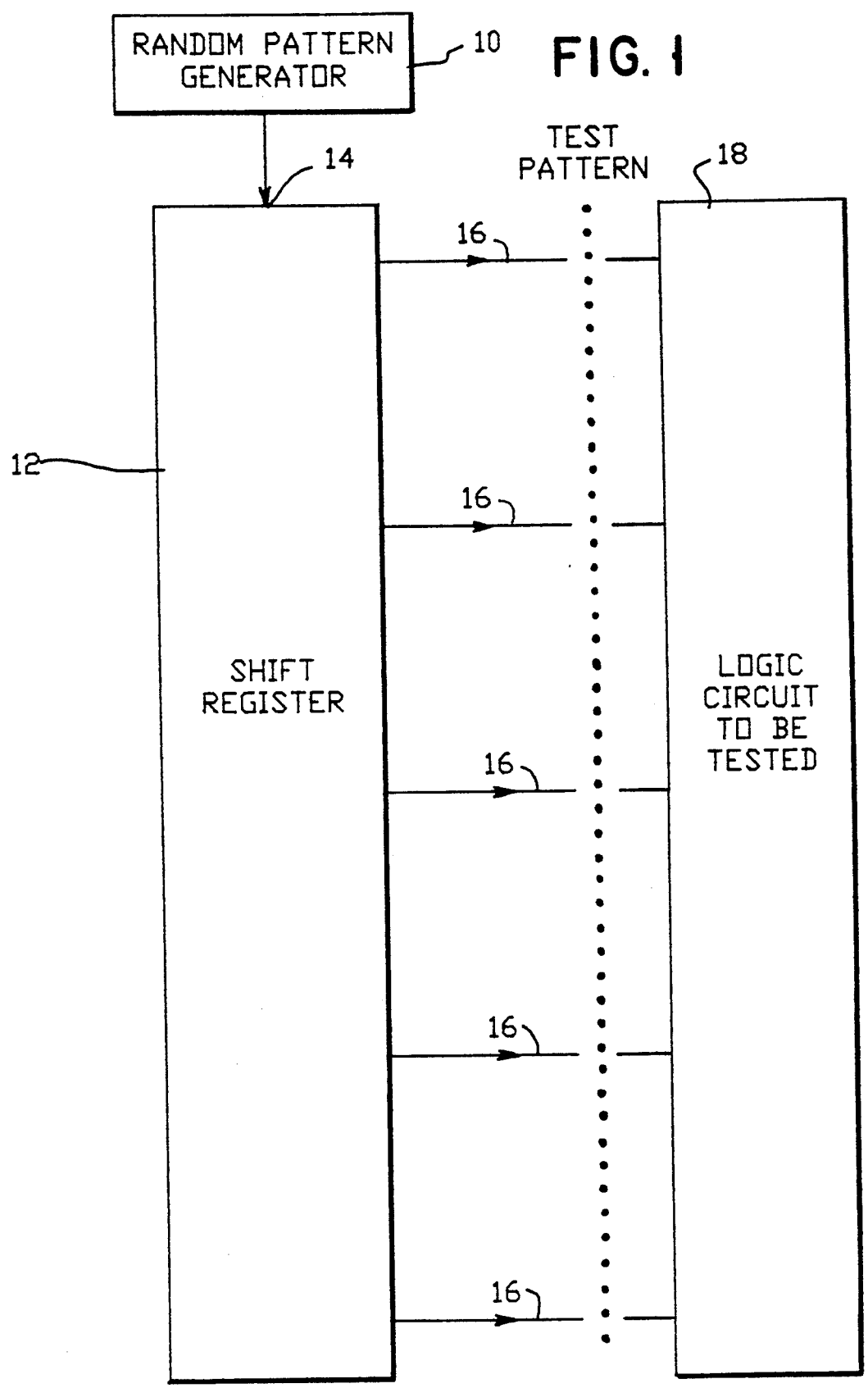
FIG. 1 is a block diagram of an example of an apparatus for generating test patterns according to the present invention.

FIG. 1 is a block diagram of an example of an apparatus for generating test patterns according to the present invention. The apparatus comprises a random pattern generator 10 for generating a series of digit signals at an output of the random pattern generator. Each digit signal in the series has an initial probability of having a first value. The initial probability is adjustable.

Preferably, each digit signal has one of only first and second values. The first value of the digit signal may, for example, represent one. The second value of the digit signal may, for example, represent zero. In this case, each digit signal generated by the random pattern generator 10 has a probability $P_1$ of representing one, and has a probability $P_0 = 1 - P_1$ of representing zero. The probabilities $P_1$ and $P_0$ are adjustable.

The apparatus for generating test patterns further comprises a shift register 12. The shift register 12 stores a plurality of digit signals of a test pattern. The shift register 12 has an input 14 for receiving digit signals from the output of the random pattern generator 10.

The shift register 12 has a plurality of outputs 16 for outputting a test pattern comprising the stored digit signals. The test pattern output from shift register 12 is provided to the input of a logic circuit 18 to be tested.

Figure 2:
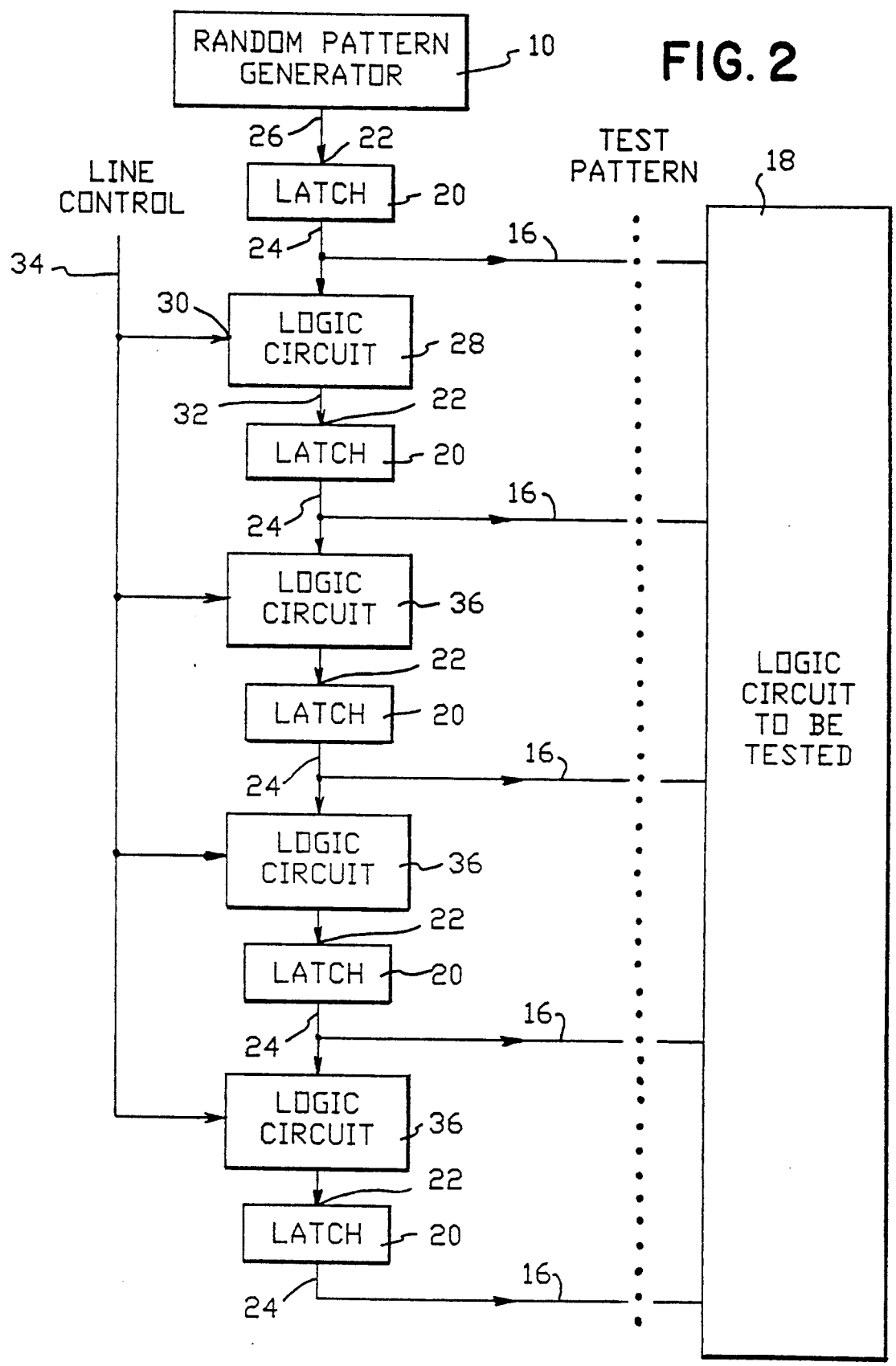
FIGS. 2 through 5 are more detailed block diagrams of examples of apparatus for generating test patterns according to the present invention.

FIG. 2 shows a more detailed block diagram of an example of an apparatus for generating test patterns according to the present invention. As shown in FIG. 2, the shift register 12 comprises a series of latches 20. While five latches are shown, the number of latches may be any number, and are related to the desired number of digits in the test pattern. Each latch 20 has an input 22 and has an output 24. The input of a first latch 20 is connected to an output 26 of the random pattern generator 10. The output 24 of each latch 20 is connected to the input 22 of a next adjacent latch. Each latch 20 stores one digit signal of a test pattern.

The shift register 12 further comprises a first logic circuit 28 for connecting the output 26 of the random generator 10 to the input 22 of the first latch 20 (as shown in FIG. 2). Alternatively, shift register 12 comprises a logic circuit 36 for connecting the output 24 of one latch 20 to the input 22 of a next adjacent latch 20.

Logic circuit 28 has first and second states, and a control input 30 for selecting either the first or the second state. The logic circuit 28 has a data output 32 for outputting a series of digit signals.

Each digit signal output by the logic circuit 28 has a first output probability of having the first value when the logic circuit is in the first state. The first output probability from logic circuit 28 is independent of the initial probability produced by random pattern generator 10. Each digit signal output by the logic circuit 28 has a second output probability of having the first value when the logic circuit is in the second state. The second output probability of logic circuit 28 is dependent upon the initial probability produced by random pattern generator 10.

A control line 34 is connected to the control input 30 of logic circuit 28 for selecting either the first or the second state of logic circuit 28.

The apparatus for generating test patterns according to the invention may further comprise one or more second logic circuits 36. Each second logic circuit 36 connects the output 24 of a latch 20 to the input 22 of a next adjacent latch 20. In the example shown in FIG. 2, the first logic circuit 28 is arranged in the shift register 12 between the random pattern generator 10 and second logic circuits 36.

In general, any logic circuit 36 need not perform the same logic function as logic circuit 28 or as any other logic circuit 36.

Each latch 20 in the apparatus for generating test patterns is preferably a binary electronic latch such as a flip-flop circuit.

Figure 3:
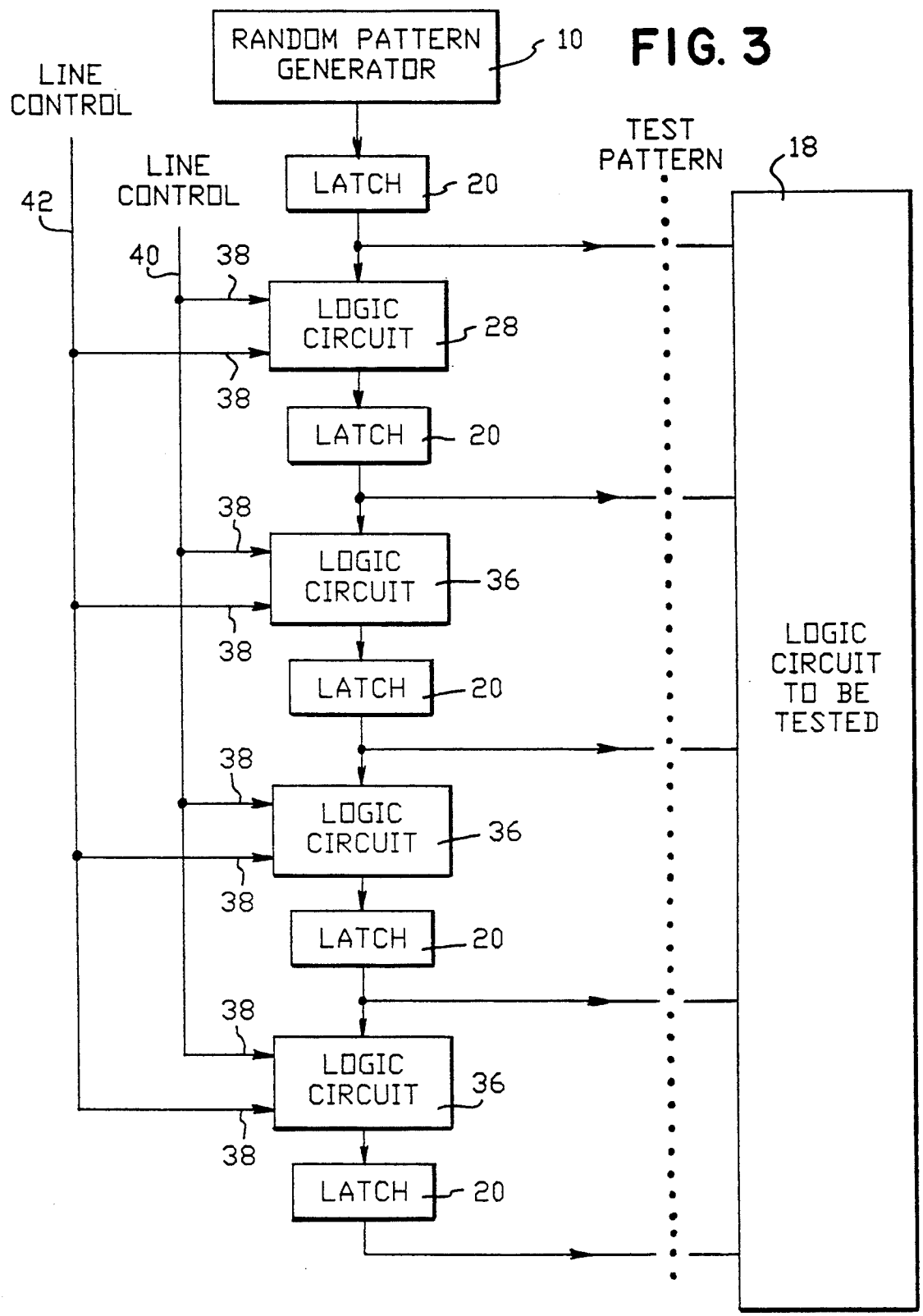

Each logic circuit 28 or 36 may, for example, have more than two states. Logic circuits 28 and 36 having three or four states can be provided with two binary control inputs 38 connected to two control lines 40 and 42 as shown in FIG. 3, in order to select one of the four states of the logic circuit.

Figure 4:
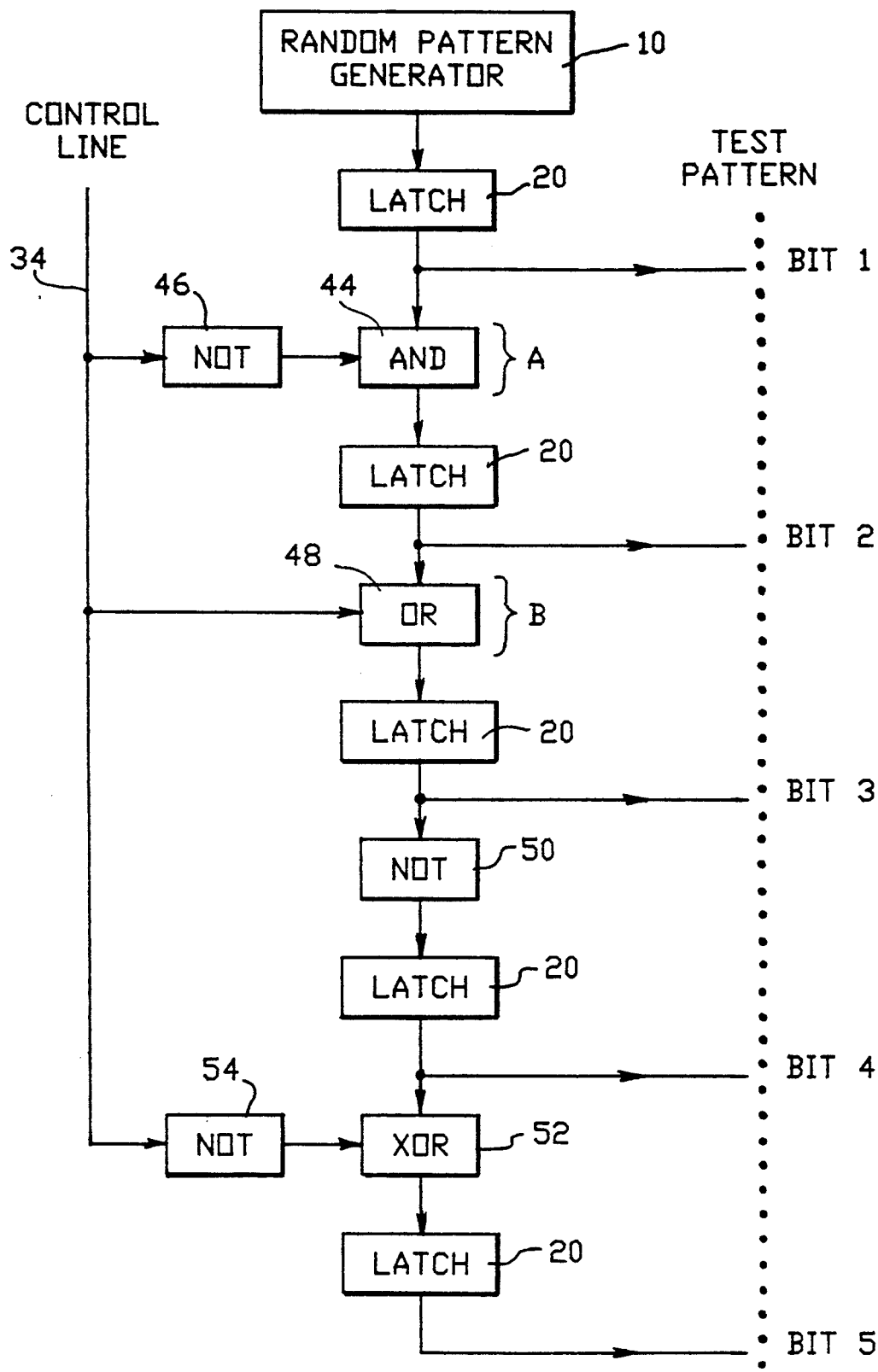

FIG. 4 is a more detailed block diagram of another example of an apparatus for generating test patterns according to the present invention. Logic circuit A in FIG. 4 comprises AND gate 44 and NOT gate 46. As shown in Table 1, when control line 34 has a value of 1, logic circuit A is in State 1. When control line 34 has a value of 0, logic circuit A is in State 2.

TABLE 1

| | LOGIC CIRCUIT A | |
|---|---|---|
| Output Probability | State 1 C34=1 | State 2 C34=0 |
| Prob(1) | 0 | P |
| Prob(0) | 1 | 1−P |
| Prob(1) for random pattern generator = P | | |

When logic circuit A is in State 1, the probability of outputting a 1 is zero, and the probability of outputting 0 is one. Thus, when logic circuit A is in State 1, the output probabilities are independent of the initial probability P produced by the random pattern generator 10.

On the other hand, when logic circuit A is in State 2, the probability that logic circuit A will output a 1 is P, and the probability of outputting 0 is 1−P, where the probability that random pattern generator 10 will output a 1 is P. In State 2, the output probabilities of logic circuit A are dependent on the initial output probability P produced by the random pattern generator 10.

Still referring to FIG. 4, logic circuit B comprises OR gate 48. As shown in Table 2, logic circuit B is in State 1 when control line 34 has a value of 1. Logic circuit B is in State 2 when control line 34 has a value of 0.

TABLE 2

| | LOGIC CIRCUIT B | |
|---|---|---|
| Output Probability | State 1 C34=1 | State 2 C34=0 |
| Prob(1) | 1 | P |
| Prob(0) | 0 | 1−P |
| Prob(1) for random pattern generator = P. Logic Circuit A in State 2 for prior time interval. | | |

When logic circuit A is in State 2 during a prior state, and when the current state of logic circuit B is State 1, then the probability of logic circuit B outputting a 1 is one, and the probability of logic circuit B outputting a 0 is zero. In this case, the output probabilities are independent of the initial output probability P provided by the random pattern generator 10.

On the other hand when logic circuit A is in State 2 during a prior time interval, and when logic circuit B is currently in State 2, then the probability of logic circuit B outputting a 1 is P, and the probability of logic circuit B outputting a 0 is 1−P. Thus, in State 2, the output probabilities of logic circuit B are dependent upon the initial output probability P produced by the random pattern generator 10.

In addition to logic circuits A and B, the apparatus of FIG. 4 comprises a NOT gate 50 whose output is the inverse of its input. NOT gate 50 has no control input.

The apparatus shown in FIG. 4 also includes a logic circuit formed by XOR gate 52 (an exclusive OR gate) and NOT gate 54. NOT gate 54 has a control input connected to the control line 34. The output of XOR gate 52 will be equal to its input when control line 34 has a value of 1. On the other hand, the output of XOR gate 52 will be the inverse of its input when control line 34 has a value of 0. Consequently, in both states of this logic circuit, the output probabilities are dependent on the initial output probability P of random pattern generator 10.

Table 3 shows an example of how to operate the test pattern generator shown in FIG. 4.

TABLE 3

| Time Interval | State C1 | TEST PATTERN A Prob(BITX=1) | | | | |
|---|---|---|---|---|---|---|
| | | BIT1 | BIT2 | BIT3 | BIT4 | BIT5 |
| t | 0 | P | ? | ? | ? | ? |
| t+1 | 0 | P | P | ? | ? | ? |
| t+2 | 0 | P | P | P | ? | ? |
| t+3 | 0 | P | P | P | P̄ | ? |
| t+4 | 0 | P | P | P | P̄ | P |
| t+4 | 1 | P | 0 | 1 | P̄ | P̄ |
| Prob(1) for random pattern generator = P. | | | | | | |

For each time interval, random pattern generator 10 generates a digit signal having a probability P of representing 1. For each time interval, the digit signal generated by random pattern generator 10 is shifted into the first adjacent latch 20. For each time interval, the digit signal stored in each latch 20 is shifted to the next adjacent latch 20.

As shown in Table 3, above, during the first four time intervals t through (t+3), the control line 34 has a value of 0. For each time interval, Table 3 shows the probability that Bits 1 through 5 will have a value of 1. The symbol "?" means the probability cannot be determined.

During the fifth time interval (t+4), a first nonuniform weighted random test pattern can be selected by applying a value of 0 to control line 34. Alternatively, a second nonuniform weighted random test pattern can be obtained by applying a value of 1 to control line 34.

Figure 5:
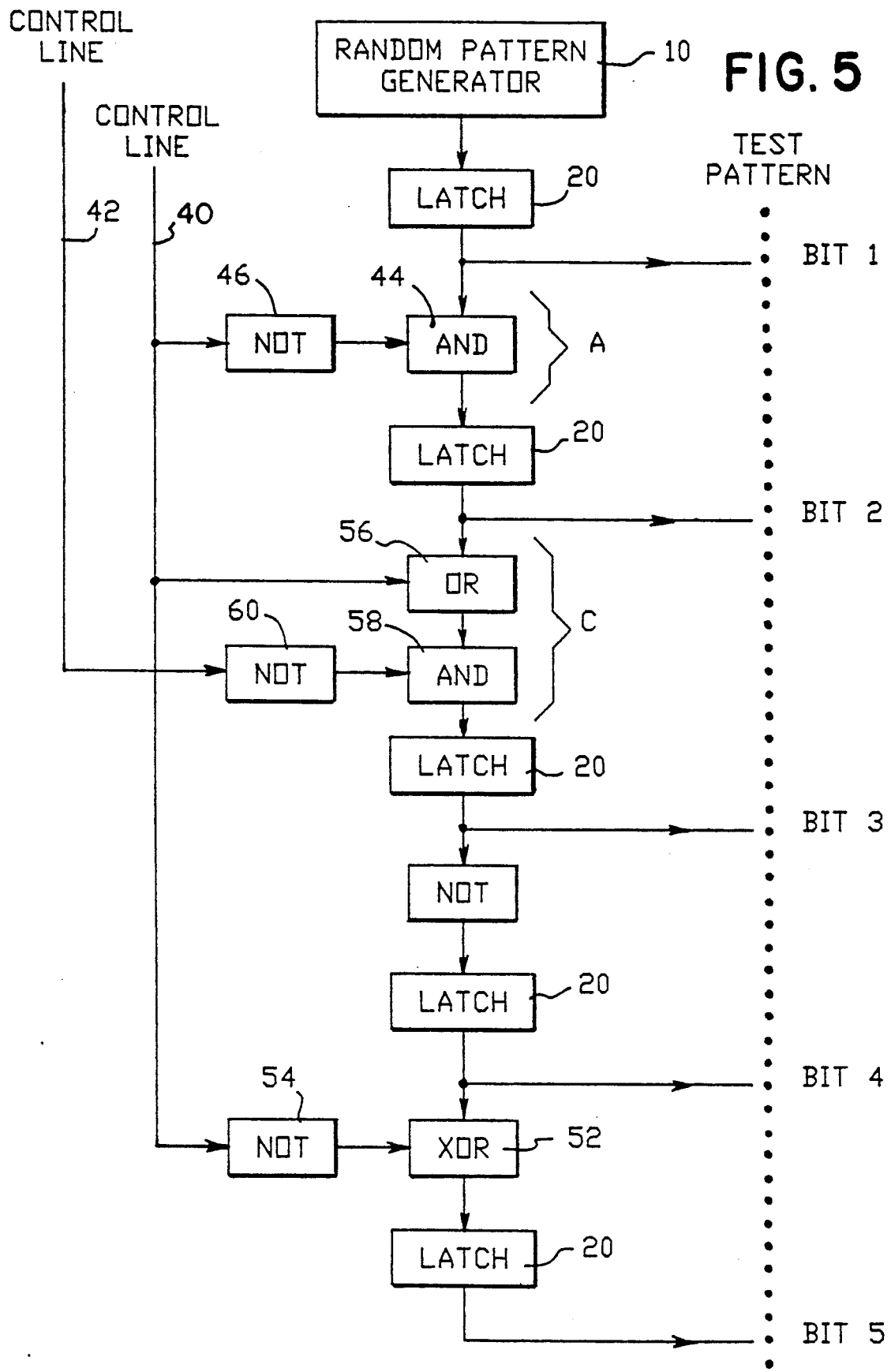

FIG. 5 shows another example of an apparatus for generating test patterns according to the invention. The latches and gates of FIG. 5 correspond to those of FIG. 4, except for logic circuit C of FIG. 5. Logic circuit C comprises OR gate 56, AND gate 58, and NOT gate 60. OR gate 56 has a control input connected to control line 40. NOT gate 60 has a control input connected to control line 42.

As shown in Table 4, logic circuit 3 is in State 1 when control line 40 has a value of 0, and control line 42 has a value of 0. Logic circuit C is in State 2 when control line 40 has a value of 1, and control line 42 has a value of 0. Logic circuit C in State 3 when control line 40 has a value of 1, and control line 42 has a value of 1.

TABLE 4

| | LOGIC CIRCUIT C | | |
|---|---|---|---|
| Output Probability | State 1 C40=1, C42=0 | State 2 C40=0, C42=0 | State 3 C40=1, C42=1 |
| Prob(1) | 1 | P | 0 |
| Prob(0) | 0 | 1−P | 1 |
| Prob(1) for random pattern generator = P. Logic Circuit A in State 2 for prior time interval. | | | |

When logic circuit C is in State 1 or State 3, the output probabilities of logic circuit C are independent of the initial output probability of random pattern generator 10. In State 1, the probability that logic circuit C will output a 1 is one, and the probability that logic circuit C will output 0 is zero. In State 3, the probability that logic circuit C will output a 1 is zero, and the probability that logic circuit C will output 0 is one.

On the other hand, when logic circuit C is in State 2, the probability that logic circuit C will output a 1 is equal to the initial probability P that the random pattern generator 10 will generate a 1. The probability that logic circuit C will output a 0 is equal to the initial probability (1−P) that random pattern generator 10 will output a 0. Both output probabilities are therefore dependent on the initial output probabilities of random pattern generator 10.

Table 5 shows one method of using the test pattern generator of FIG. 5 in order to generate weighted random patterns. During each of the first four time intervals t through (t+3), both control line 40 and control line 42 have values of 0. During the fifth time interval (t+4) the values of control lines 40 and 42 may be selected as shown in Table 5 to choose one of three possible nonuniform weighted random test patterns.

TABLE 5

| Time Interval | State | | TEST PATTERN B Prob(BITX=1) | | | | |
|---|---|---|---|---|---|---|---|
| | C1 | C2 | BIT1 | BIT2 | BIT3 | BIT4 | BIT5 |
| t | 0 | 0 | P | ? | ? | ? | ? |
| t+1 | 0 | 0 | P | P | ? | ? | ? |
| t+2 | 0 | 0 | P | P | P | ? | ? |
| t+3 | 0 | 0 | P | P | P | P̄ | ? |
| t+4 | 0 | 0 | P | P | P | P̄ | P |
| t+4 | 1 | 0 | P | 0 | 1 | P̄ | P̄ |
| t+4 | 1 | 1 | P | 0 | 0 | P̄ | P̄ |

Prob(1) for random pattern generator = P.

Figure 6:
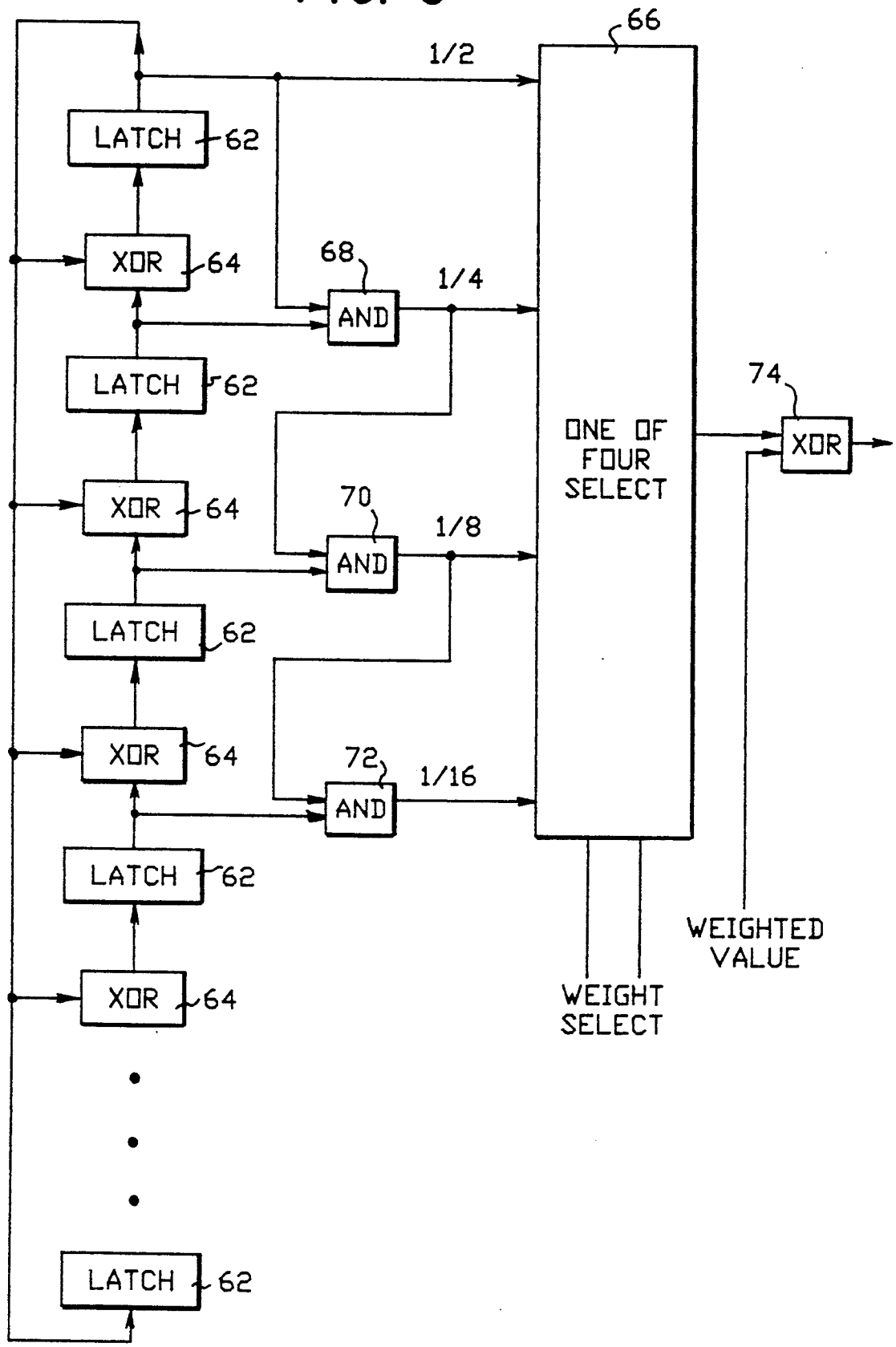
FIG. 6 is a block diagram of an example of a random pattern generator for use in the apparatus for generating test patterns according to the invention.

FIG. 6 is a block diagram of an example of a random pattern generator 10. In this example, the random pattern generator comprises a linear feedback shift register having a series of latches 62 separated by XOR gates 64. There may be, for example, thirty-two latches 62 forming a thirty-two bit linear feedback shift register.

A multiplexer 66 has weight select inputs for selecting one of four inputs for connection to its output. The first input is the last bit of the linear feedback shift register, and has a probability of ½ of generating a 1. The second input to multiplexer 66 is the output of AND gate 68, which performs an AND function on the last two bits of the linear feedback shift register. The output of AND gate 68 has a probability of ¼ of generating a 1.

The third input to multiplexer 66 is the output of AND gate 70, which performs an AND function on the last three bits of the linear feedback shift register. The output of AND gate 70 has a probability of ⅛ of generating a 1. Finally, the fourth input to multiplexer 66 is AND gate 72 which performs an AND function on the last four bits of the linear feedback shift register. The output of AND gate 72 has a probability of 1/16 of generating a 1.

The output of multiplexer 66 is provided to one input of XOR gate 74. Another input of XOR gate 74 selects a weighted value of "0" or "1" for the output probabilities of ½, ¼, ⅛, and 1/16.

We claim:

1. An apparatus for generating test patterns, said apparatus comprising:
    a random pattern generator for generating a series of digit signals at an output of the random pattern generator, each digit signal in the series having an initial probability of having a first value, the initial probability being adjustable;
    a shift register for storing a plurality of digit signals of a test pattern, said shift register having an input for receiving digit signals from the output of the random pattern generator, said shift register having a plurality of outputs for outputting a test pattern comprising the stored digit signals;
    characterized in that the shift register comprises:
    a series of latches, each latch having an input and having an output, the input of a first latch being connected to the output of the random pattern generator, the output of each latch being connected to the input of a next adjacent latch, each latch storing one digit signal of a test pattern; and
    at least a first logic circuit for connecting the output of the random pattern generator to the input of the first latch or for connecting the output of a latch to the input of a next adjacent latch, said logic circuit having first and second states, and a control input for selecting either the first state or the second state, said logic circuit having a data output for outputting a series of digit signals, each digit signal output by the logic circuit having a first output probability of having the first value when the logic circuit is in the first state, the first output probability being independent of the initial probability, each digit signal output by the logic circuit having a second output probability of having the first value when the logic circuit is in the second state, the second output probability being dependent on the initial probability.

2. An apparatus as claimed in claim 1, characterized in that the latch is a binary electronic latch, and each digit signal has one of only first and second values.

3. An apparatus as claimed in claim 2, characterized in that the first value of the digit signal represents one, the second value of the digit signal represents zero, and each digit signal generated by the random pattern generator has a probability $P_1$ of representing one, and has a probability $P_0 = 1 - P_1$ of representing zero.

4. An apparatus as claimed in claim 3, characterized in that
    each digit signal output by the logic circuit has a probability $R_1$ of representing one, and has a probability $R_0 = 1 - R_1$ of representing zero when the logic circuit is in the first state; and
    each digit signal output by the logic circuit has a probability $Q_1$ of representing one, and has a probability $Q_0 = 1 - Q_1$ of representing zero when the logic circuit is in the second state.

5. An apparatus as claimed in claim 4, characterized in that the logic circuit comprises a logical OR gate having a first input connected to the output of the random pattern generator or to the output of a latch, and having a second input connected to a control line.

6. An apparatus as claimed in claim 4, characterized in that the logic circuit comprises a logical AND gate having a first input connected to the output of the random pattern generator or to the output of a latch, and having a second input connected to a control line.

7. An apparatus as claimed in claim 4, characterized in that each latch has an input for receiving digit signals from the output of the logic circuit or from the output of a prior adjacent latch, and has an output for outputting digit signals to a circuit to be tested.

8. An apparatus as claimed in claim 7, further comprising a second logic circuit for connecting the output of a latch to the input of a next adjacent latch, said first logic circuit is arranged in the shift register between the random pattern generator and the second logic circuit.

9. An apparatus for generating test patterns, said apparatus comprising:
    a random pattern generator for generating a series of digit signals, each digit signal in the series having an initial probability of having a first value, the initial probability being adjustable;
    at least one latch for storing one digit signal of a test pattern; and a logic circuit having first and second states, a data input for receiving digit signals from the random pattern generator, a control input for selecting either the first or the second state, and a data output for outputting a series of digit signals to the latch, each digit signal output by the logic circuit having a first output probability of having the first value when the logic circuit is in the first state, the first output probability being independent of the initial probability, each digit signal output by the logic circuit having a second output probability of having the first value when the logic circuit is in the second state, the second output probability being dependent on the initial probability.

10. An apparatus as claimed in claim 9, characterized in that the latch is a binary electronic latch, and each digit signal has one of only first and second values.

11. An apparatus as claimed in claim 10, characterized in that the first value of the digit signal represents one, the second value of the digit signal represents zero, and each digit signal generated by the random pattern generator has a probability $P_1$ of representing one, and has a probability $P_0 = 1 - P_1$ of representing zero.

12. An apparatus as claimed in claim 11, characterized in that each digit signal output by the logic circuit has a probability $R_1$ of representing one, and has a probability $R_0 = 1 - R_1$ of representing zero when the logic circuit is in the first state; and each digit signal output by the logic circuit has a probability $Q_1$ of representing one, and has a probability $Q_0 = 1 - Q_1$ of representing zero when the logic circuit is in the second state.

13. An apparatus as claimed in claim 12, characterized in that the logic circuit comprises a logical OR gate having a first input connected to the output of the random pattern generator or to the output of a latch, and having a second input connected to a control line.

14. An apparatus as claimed in claim 12, characterized in that the logic circuit comprises a logical AND gate having a first input connected to the output of the random pattern generator or to the output of a latch, and having a second input connected to a control line.

15. An apparatus as claimed in claim 12, characterized in that the latch has an input for receiving digit signals from the output of the logic circuit, and has an output for outputting digit signals to a circuit to be tested.

16. An apparatus as claimed in claim 15, further comprising a second latch for storing one digit signal of a test pattern, said second latch having an input for receiving digit signals from the output of the random pattern generator, and having an output for outputting digit signals to the logic circuit.

* * * * *